United States Patent
Kwon

[11] Patent Number: 5,926,045
[45] Date of Patent: *Jul. 20, 1999

[54] PERIOD CONTROLLABLE FREQUENCY GENERATOR

[75] Inventor: Oh Bong Kwon, Kyoungkido, Rep. of Korea

[73] Assignee: Hyundai Electronics Industries Co., Ltd., Kyoungkido, Rep. of Korea

[ * ] Notice: This patent issued on a continued prosecution application filed under 37 CFR 1.53(d), and is subject to the twenty year patent term provisions of 35 U.S.C. 154(a)(2).

[21] Appl. No.: 08/773,565

[22] Filed: Dec. 27, 1996

[30] Foreign Application Priority Data

Dec. 29, 1995 [KR] Rep. of Korea ....................... 95-64427

[51] Int. Cl.$^6$ ................................................. H03B 19/00
[52] U.S. Cl. .......................... 327/114; 327/278; 327/284; 331/57
[58] Field of Search ............................. 331/57; 327/113, 327/114, 166, 276, 277, 278, 284

[56] References Cited

U.S. PATENT DOCUMENTS

| | | | |
|---|---|---|---|
| 4,806,804 | 2/1989 | O'Leary | 307/605 |
| 4,899,071 | 2/1990 | Morales | 307/605 |
| 5,061,907 | 10/1991 | Rasmussen | 331/57 |
| 5,180,995 | 1/1993 | Hayashi et al. | 331/57 |
| 5,231,319 | 7/1993 | Crafts et al. | 307/603 |
| 5,331,295 | 7/1994 | Jelinek et al. | 331/57 |
| 5,349,311 | 9/1994 | Mentzer | 331/57 |
| 5,459,755 | 10/1995 | Iga et al. | 375/376 |
| 5,499,214 | 3/1996 | Mori et al. | 365/222 |

*Primary Examiner*—Toan Tran
*Assistant Examiner*—An T. Luu
*Attorney, Agent, or Firm*—Jacobson, Price, Holman & Stern, PLLC

[57] ABSTRACT

A frequency generator is disclosed including a plurality of inverters employing the gate of a PMOS and NMOS as their common input, and employing the source of the PMOS and drain of the NMOS as their common output, the plurality of inverters being serially connected, the output node of the output inverter being connected to the input node of the input inverter; and a current mirror consisting of two transistors having the same electrical characteristic, the current mirror being connected to the source of the NMOS of the input inverter, a signal transmission delay time of the current mirror being controlled by a predetermined current value applied from an external current source.

6 Claims, 1 Drawing Sheet

PERIOD CONTROLLABLE FREQUENCY GENERATOR

BACKGROUND OF THE INVENTION

1. Field of the Invention

The present invention relates to a frequency generator and, more particularly, to a ring oscillator in which the current value is externally controlled in order to control the period of frequency, to thereby finely control the frequency and make it possible to use in various frequency bands.

2. Discussion of Related Art

Recently, a circuit configuration which can be used in various operation frequency bands has been required in electronic systems. That is, the operation frequency range of circuits becomes wider. As shown in FIG. 1, a conventional ring oscillator generates a frequency using a signal transmission delay value obtained by one NAND gate and N inverter circuits.

Referring to FIG. 1, the conventional ring oscillator is constructed in such a manner that one NAND gate having two inputs, a plurality of inverters $I_1, I_2, \ldots, I_{N-1}, I_N$ for delaying the output signal of the NAND gate are serially connected, the output signal from inverter $I_N$ is applied to one input of the NAND gate, and a control signal is applied to the other input of the NAND gate. By doing so, a delay signal of the transmitted signal obtained through the inverters is fedback to the input of the NAND gate, and the delay signal and a control signal which is applied from a main circuit are logically operated, to thereby generate a predetermined frequency.

In order to generate a desired frequency, the number of inverters is increased or decreased in the aforementioned conventional ring oscillator. That is, the hardware of the ring oscillator should be changed. As described above, in case that the frequency should be changed, or a frequency in a different band is required, it is impossible to externally operate the conventional ring oscillator. Furthermore, a new oscillator must be fabricated for the purpose of changing its hardware.

SUMMARY OF THE INVENTION

Accordingly, the present invention is directed to a ring oscillator that substantially obviates one or more of the problems due to limitations and disadvantages of the related art.

An object of the present invention is to provide a ring oscillator in which the electrical characteristic of one of elements forming the ring oscillator is easily controlled, to generate a predetermined frequency.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a frequency generator includes a plurality of inverters employing the gate of a PMOS and NMOS as their common input, and employing the source of the PMOS and drain of the NMOS as their common output, the plurality of inverters being serially connected, the output node of the output inverter being connected to the input node of the input inverter; and a current mirror consisting of two transistors having the same electrical characteristic, the current mirror being connected to the source of the NMOS of the input inverter, a signal transmission delay time of the current mirror being controlled by a predetermined current value applied from an external current source.

It is to be understood that both the foregoing general description and the following detailed description are exemplary and explanatory and are intended to provide further explanation of the invention as claimed.

BRIEF DESCRIPTION OF THE ATTACHED DRAWINGS

The accompanying drawings, which are included to provide a further understanding of the invention and are incorporated in and constitute a part of this specification, illustrate embodiments of the invention and together with the description serve to explain the principles of the invention:

DETAILED DESCRIPTION OF PREFERRED EMBODIMENT

Reference will now be made in detail to the preferred embodiments of the present invention, examples of which are illustrated in the accompanying drawings.

Figure 1:
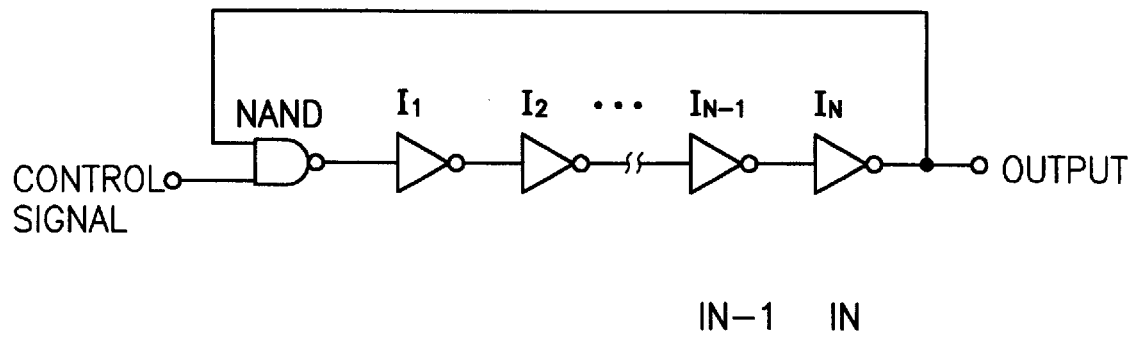
FIG. 1 is a circuit diagram of a conventional ring oscillator.
Figure 2:
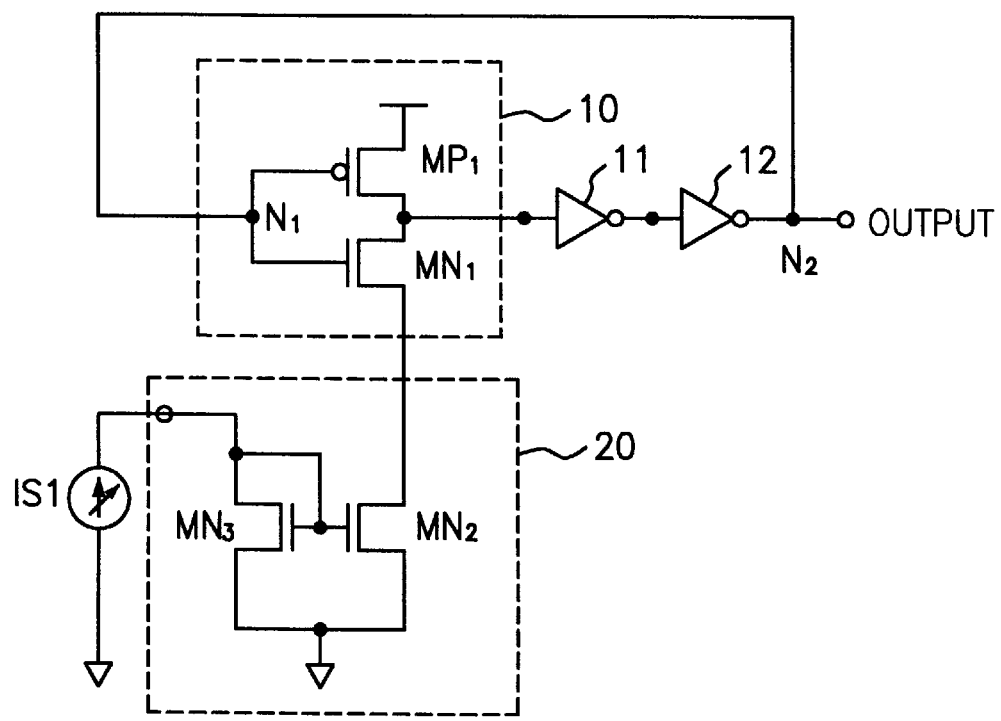
FIG. 2 is a circuit diagram of a ring oscillator according to the present invention.

FIG. 2 is a circuit diagram of a ring oscillator according to the present invention. Referring to FIG. 2, the ring oscillator of the present invention is constructed in such a manner that a plurality of inverters 10, 11 and 12 are serially connected, output node N2 of output inverter 12 is connected to input node N1 of input inverter 10, and a current mirror 20 consisting of two transistors MN2 and MN3 having the same electrical characteristics is connected to the source of input inverter 10. The signal transmission delay time of current mirror 20 is controlled by a predetermined current value applied from an external current source IS1. The gate of PMOS transistor MP1 and NMOS transistor MN1 is the common input of plurality of inverters 10, 11 and 12, and the source of PMOS transistor MP1 and drain of NMOS transistor MN1 are the common output of them. The source of NMOS transistor MN1 is connected to current mirror 20 controlling the signal transmission delay time according to a predetermined current value applied from external current source IS1.

Current mirror 20 is constructed in such a manner that the source of two NMOS transistors MN2 and MN3 are connected in common, the drain of NMOS transistor MN2 and the gates of NMOS transistors MN2 and MN3 are connected in common, and are connected to external current mirror IS1. The signal transmission delay time is determined by the current characteristic of NMOS transistor MN2 connected to NMOS transistor MN1 of input inverter 10. The current characteristic of NMOS transistors MN2 and MN3 are the same. The current characteristic of NMOS transistor MN3 is controlled by the current value of external current source IS1. By doing so, the current characteristic of NMOS transistor MN2 is changed to thereby control the signal transmission delay time, and result in change of the frequency characteristic of the ring oscillator.

According to the present invention, the electrical characteristic of the current mirror which is an element of the ring oscillator can be controlled by the external current source. Thus, a desired frequency can be easily generated.

It will be apparent to those skilled in the art that various modifications and variations can be made in the ring oscillator of the present invention without departing from the spirit or scope of the invention. Thus, it is intended that the present invention cover the modifications and variations of this invention provided they come within the scope of the appended claims and their equivalents.

What is claimed is:

1. A variable frequency generator formed on a chip, comprising:

a plurality of inverters each employing gates of a PMOS and NMOS as their common input, and employing a source of the PMOS and a drain of the NMOS as their common output, the plurality of inverters being serially connected, an output node of a last inverter being connected to an input node of a first inverter;

an external current source being controllable and formed outside of the chip; and a current mirror consisting of two NMOS transistors having the same electrical characteristic, the current mirror being connected to a source of a NMOS of the first inverter, a signal transmission delay time of the current mirror being controlled by a current value supplied from the external current source, so that a frequency of the generator varies depending on the current value supplied from the external current source.

2. The frequency generator as claimed in claim 1, wherein the current mirror consists of two transistors having the same electrical characteristic in order to control the signal transmission delay time according to a predetermined current value applied from the external current source.

3. The frequency generator as claimed in claim 1, the current mirror is constructed in such a manner that the source of two NMOSs are connected in common, and the drain of one NMOS and the gate of the two NMOSs are connected in common, to be thereby connected to the external current source.

4. A variable frequency generator formed on a chip, comprising:

a plurality of inverters each employing gates of a PMOS and NMOS as their common input, and employing a source of the PMOS and a drain of the NMOS as their common output, the plurality of inverters being serially connected, an output node of a last inverter being connected to an input node of a first inverter;

a current source receiving means for receiving an output from a current source, wherein the current source is controllable and is formed outside of the variable frequency generator; and a current mirror consisting of two NMOS transistors having the same electrical characteristic, the current mirror being connected to a source of a NMOS of the first inverter, a signal transmission delay time of the current mirror being controlled by a current value supplied from the external current source, so that a frequency of the generator varies depending on the current value supplied from the external current source.

5. The frequency generator as claimed in claim 4, wherein the current mirror consists of two transistors having the same electrical characteristic in order to control the signal transmission delay time according to a predetermined current value applied from the external current source.

6. The frequency generator as claimed in claim 4, the current mirror is constructed in such a manner that the source of two NMOSs are connected in common, and the drain of one NMOS and the gate of the two NMOSs are connected in common, to be thereby connected to the external current source.

* * * * *